United States Patent [19]
Lasch, Jr.

[11] 3,947,236
[45] Mar. 30, 1976

[54] FLUID BEARING TRANSFER AND HEAT TREATING APPARATUS AND METHOD

[76] Inventor: Cecil A. Lasch, Jr., 20200 Lucille Drive, Cupertino, Calif. 95014

[22] Filed: Mar. 21, 1974

[21] Appl. No.: 453,213

Related U.S. Application Data

[63] Continuation of Ser. No. 203,086, Nov. 29, 1971, abandoned.

[52] U.S. Cl. .................. 432/11; 165/65; 214/1 BE; 302/2 R; 302/29; 302/31; 432/80; 432/121
[51] Int. Cl.² ............................................ F27D 3/00
[58] Field of Search ...... 302/2 R, 29, 31; 214/1 BE; 432/11, 121, 80; 165/65

[56] References Cited
UNITED STATES PATENTS

| | | | |
|---|---|---|---|
| 3,405,977 | 10/1968 | Albright | 302/29 |
| 3,588,176 | 6/1971 | Byrne | 302/29 |
| 3,603,646 | 9/1971 | Leoff | 302/29 |
| 3,614,168 | 10/1971 | Range | 302/31 |
| 3,645,581 | 2/1972 | Lasch et al. | 302/2 R |
| 3,717,381 | 2/1973 | Hagler | 302/31 |
| 3,718,371 | 2/1973 | Lasch | 302/31 |
| 3,731,823 | 5/1973 | Goth | 302/31 |

*Primary Examiner*—John J. Camby
*Attorney, Agent, or Firm*—Flehr, Hohbach, Test, Albritton & Herbert

[57] ABSTRACT

An improved apparatus and method for transferring articles, such as silicon and like wafers used in making electronic devices from one station to another at variable rates of movement utilizing a fluid bearing. The apparatus and method also provide for heat treating the wafers in a furnace through which the fluid bearing extends.

The fluid bearing track structure utilized is produced from a refractory, heat-resistant material, such as quartz or silicon carbide, and comprises an enclosed tube having fluid bearing passages through the base wall thereof in communication with fluid supply means. The track structure is operatively divided into at least two track sections positioned as linear continuations of each other.

Article receiving means for automatically feeding articles in sequence from a supply thereof and for accepting articles in sequence following completion of treatment thereof are provided at the stations between which the wafers are transferred. Such means includes automatically indexable magazines for discharging and receiving wafers in sequence.

The fluid bearing apparatus and method is constructed to rapidly accelerate slow moving or stopped wafers in sequence onto means for rapidly cooling the wafers after heat treatment so that rapid and uniform quenching may be effected and uniform results insured.

27 Claims, 4 Drawing Figures

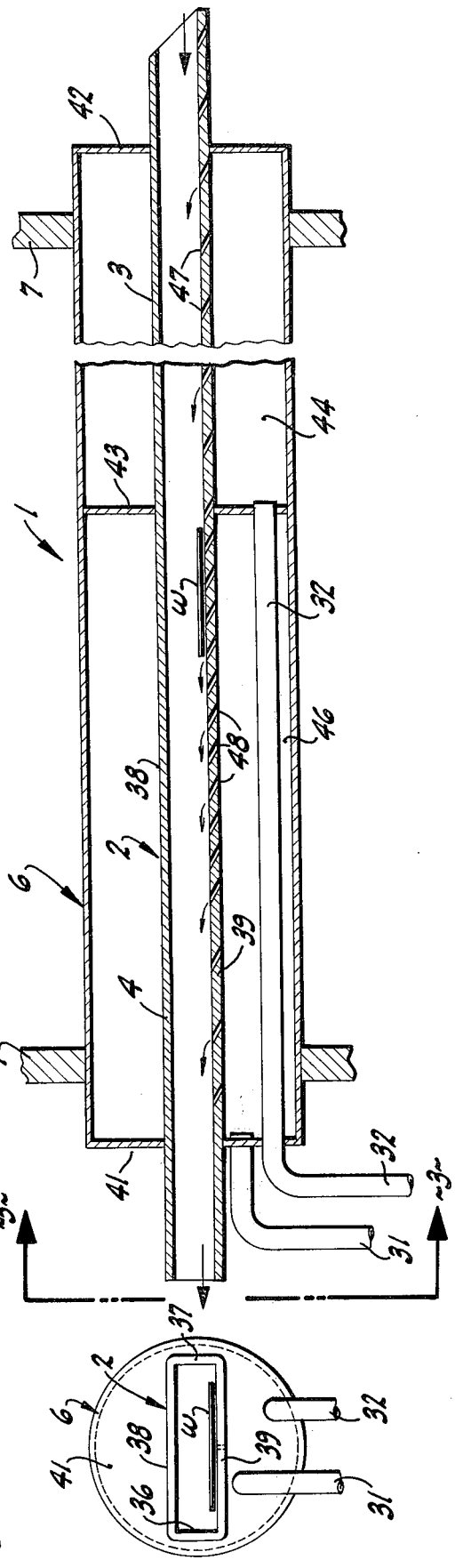
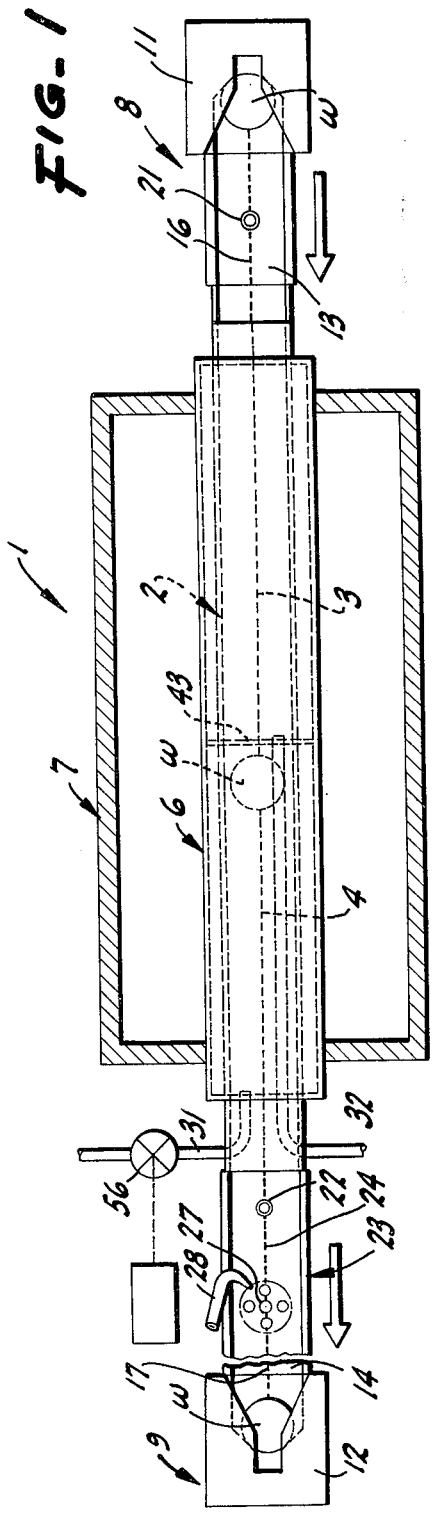

FLUID BEARING TRANSFER AND HEAT TREATING APPARATUS AND METHOD

This is a continuation of application Ser. No. 203,086 filed Nov. 29, 1971, now abandoned.

CROSS-REFERENCE TO RELATED APPLICATIONS

The fluid bearing track structure utilized in the subject apparatus and method has been designed to meet the particular needs encountered in the high temperature transfer of articles as will be described. However, the article receiving means positioned at the respective stations between which the articles are transferred, and that portion of the fluid bearing track structure utilized in conjunction with such article receiving means may take the form illustrated and described in Lasch et al. application, Ser. No. 779,033, "Apparatus and Method for Handling and Treating of Articles", filed Nov. 26, 1968 now U.S. Pat. No. 3,645,581 dated Feb. 29, 1972; and Lasch application, Ser. No. 174,808, "Fluid Bearing Track Structure and Components Thereof and Method of Producing Same", filed Aug. 25, 1971, now U.S. Pat. No. 3,718,371 dated Feb. 27, 1973. Such applications illustrate desirable means for automatically indexing magazines from which articles may be fed in sequence and into which articles may be introduced in sequence in conjunction with fluid bearing track structure provided as an integral part of such article receiving means for outfeeding and infeeding articles automatically therefrom.

BACKGROUND OF THE INVENTION

1. Field of the Invention

This invention relates generally to the field of improved fluid bearing track structures, components thereof, and methods of utilizing the same in conjunction with transferring articles, particularly fragile articles such as silicon and like wafers, between predetermined stations. More particularly, this invention relates to the field of procedures for transferring articles between stations on a fluid bearing at selectively variable rates of movement, including if desired, a full stop or dwell for predetermined periods of time, followed by rapid acceleration to a predetermined location.

Still more particularly, this invention relates to the field of high temperature fluid bearing track structures which are heat resistant and which may be incorporated into a heat treating apparatus in which articles, such as silicon and like wafers commonly utilized in the production of electronic devices, may be heat treated. This invention also relates to the field of apparatus and methods for rapidly quenching such heated articles in a procedure which insures uniformly reproducible results.

This invention further relates to the field of improved refractory type heat resistant fluid bearing track structures utilizable in heat treating devices, such as diffusion furnaces commonly and extensively utilized in the electronics industry in the manufacture of semiconductor and like electronic devices. In that regard, while in its more specific aspects, the track structure and method of this invention relate to the improved fluid bearing handling and transferring of articles utilized in the production of electronic devices, such as semiconductor wafers, its applicability in other fields in which articles are required to be automatically transported under controlled non-manual conditions at variable rates of movement also should be recognized.

2. Description of the Prior Art

Fluid bearing track structures for utilization in the handling and transfer of fragile articles, such as silicon and like wafers utilized in the manufacture of semiconductor devices, have been known heretofore, as described in the above identified Lasch et al and Lasch applications. Such prior known track structures, however, were devised for utilization generally at normal temperatures and, because of the materials from which the same are produced, such track structures are not utilizable in conjunction with article handling systems requiring transfer of articles through high temperature environments.

So far as is known, the apparatus, the particular track structure, and the transfer method disclosed herein have been unknown heretofore, and have not been used in conjunction with transferring of articles through a high temperature furnace. More particularly, so far as is known, the track structure disclosed has not been utilized heretofore in conjunction with transfer of articles at variable rates of movement, including if desired, a full stop or dwell, and a rapid acceleration.

In the electronics industry when high temperature treatment of silicon or like wafers is to be effected in a diffusion furnace or like heating devices, current practice calls for the furnace attendant to place a refractory carrier, such as a quartz block, on which a series of wafers are supported into the furnace for a predetermined time period. After the wafers have been heat treated in the furnace to accomplish the treatment desired, the furnace attendant manually withdraws the carrier block from the furnace as rapidly as possible and sets the hot carrier on a cold metal plate to effect cooling of the carrier and the wafers carried thereon. Such cooling takes several seconds, with the cooling rate varying depending upon the operator's dexterity, skill and experience. As a result, the highly necessary results of rapid cooling accompanied by reproducibility of cooling time are not achievable with the manual operations heretofore encountered. Thus, the manual methods heretofore used are incapable of producing the uniformity of results producible by the present invention.

With the present invention, transfer of articles into and out of a high temperature environment is effected automatically, sequentially and without manual handling, and the reduction of temperature of individual articles in sequence is effected rapidly so that high speed operation and reproducibility of treating results are insured with uniformity in each of a series of articles being treated in the heated atmosphere.

SUMMARY OF THE INVENTION

The present invention relates to an improved fluid bearing apparatus and method for transferring generally flat articles, such as silicon and like wafers, between predetermined stations and at widely varied rates of movement, including a full stop or dwell. More particularly, this invention relates to an improved apparatus and method for utilizing an improved fluid bearing track structure for transferring articles between predetermined stations through a high temperature environment.

Still more particularly, this invention relates to a heat treating apparatus for silicon wafers and like articles utilized in producing electronic devices in which a heat resistant refractory fluid bearing track structure is positioned within a heating device, such as a gas diffusion furnace; articles are transferred therethrough in sequence for heat treatment therein, with movement through the furnace on a fluid bearing being effected automatically and without manual handling and at selectively varied speeds of movement.

This invention further relates to improved means in conjunction with a heat treating procedure for silicon wafers or like articles for automatically and rapidly quenching such articles from elevated temperatures to near room temperatures in a procedure which insures uniformity and reproducibility of results.

From the foregoing it should be understood that objects of this invention include: the provision of an improved fluid bearing apparatus and method for transferring articles between predetermined stations; the provision of an improved fluid bearing track structure utilizable in a high temperature environment; the provision of improved apparatus and method for transferring articles between predetermined stations at selectively varied rates of movement, including a full stop or dwell; the provision of improved apparatus and method for heat treating articles, such as silicon wafers or the like, utilized in the production of electronic devices, in a high temperature environment, and for rapidly and uniformly reducing the temperature of such articles following heat treatment thereof; and to the provision of an automatic apparatus and method for removing articles from a supply thereof, transferring the same in sequence on a fluid bearing through a heated atmosphere at variable rates of movement, rapidly reducing the temperature of such articles in sequence following heat treatment thereof, and introducing the same into a collector therefor.

These and other objects of this invention and various aspects thereof will become apparent from a study of the following detailed description in which reference is directed to the attached drawings.

DESCRIPTION OF THE DRAWINGS

FIG. 1 is a generally schematic plan view of the subject fluid bearing and heat treating apparatus.

FIG. 2 is a vertical sectional view through the heat resistant portion of the fluid bearing track structure of the subject apparatus.

FIG. 3 is an end elevational view of the track structure taken in the plane of line 3—3 of FIG. 2.

DESCRIPTION OF THE PREFERRED EMBODIMENTS

Figure 4:
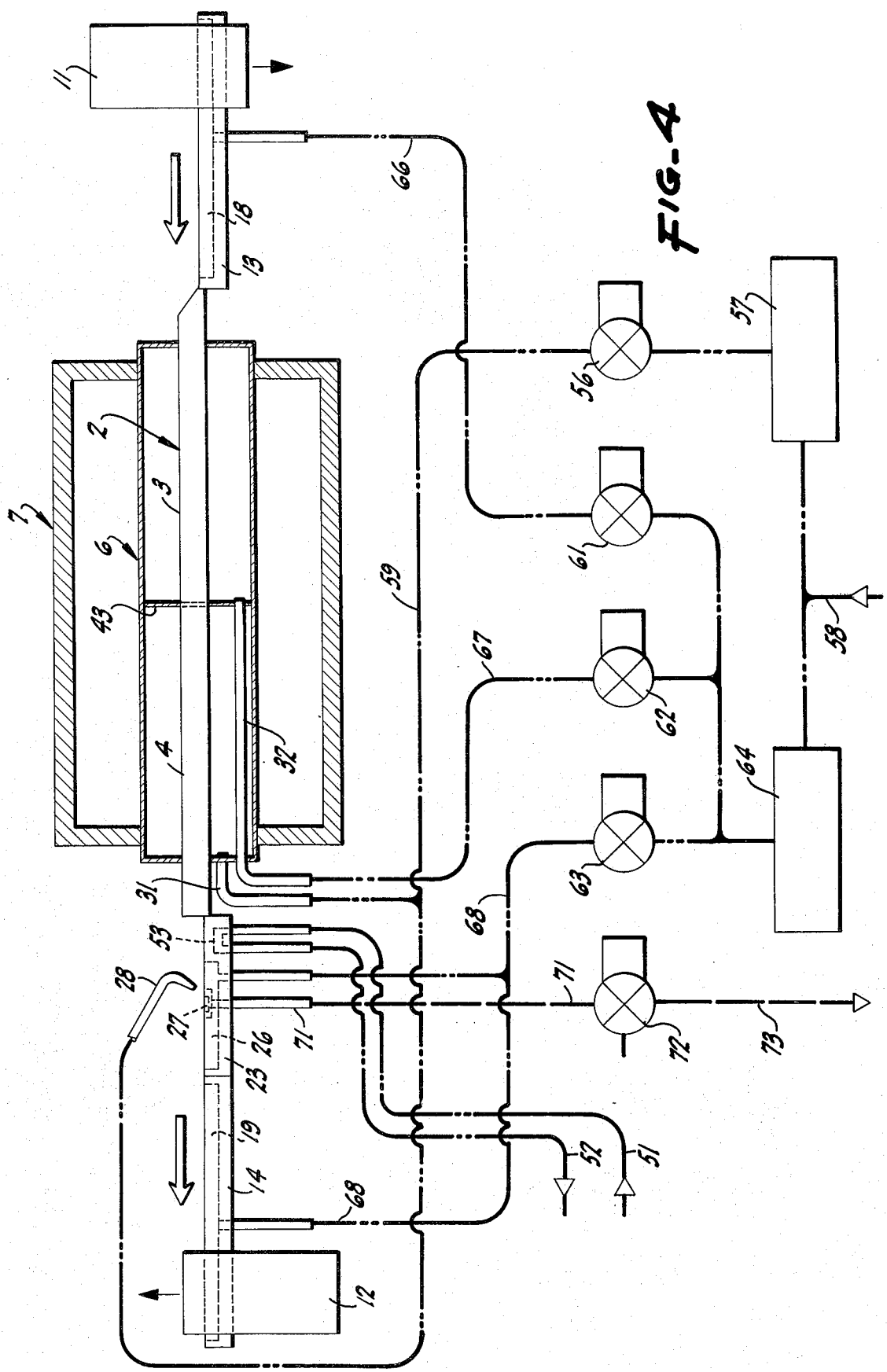
FIG. 4 is a diagrammatic view of the pneumatic and hydraulic system utilized in conjunction with the subject apparatus.

In its broader aspects, the subject invention relates to the transfer of a series of articles in sequence between two predetermined stations or locations at varied rates of speed. In its more particular aspects, the subject invention relates to an apparatus and method for sequentially transferring individual articles between an outfeed or supply station and an infeed or receiving station through a high temperature environment positioned therebetween at varied speed rates, and to means for rapidly quenching the articles in sequence after they exit from the heated environment.

To that end, the subject apparatus includes an improved fluid bearing track structure which is positioned within a conventional heating device, such as a diffusion furnace commonly utilized in the production of electronic devices in the electronics industry. Provided in conjunction with the improved track structure are article receiving means from which articles are removed in sequence and into which articles are introduced in sequence prior to and following heat treatment thereof.

While certain aspects of the subject apparatus have been utilized and known heretofore, as described previously with respect to Lasch et al. application Ser. No. 779,033 and Lasch application Ser. No. 174,808, the fabrication of semiconductor wafers by utilizing the improved fluid bearing features of this invention has been unknown heretofore and such utilization insures the highly desirable and effective results produced with this invention.

Referring first to the generally schematic view of FIG. 1, the subject apparatus is generally designated 1 and comprises an improved fluid bearing track structure generally designated 2 to be described hereinafter in detail. Such track structure includes at least two integral but operatively discrete sections 3 and 4 for the purpose to be described. The track structure 2 is heat resistant as will be described and is surrounded by a generally cylindrical transparent enclosure 6 which permits heat transmission therethrough without interference therby.

Surrounding enclosure 6 is a conventional heating means, such as a diffusion furnace or like device 7 of any suitable type commonly utilized in the electronics industry for heat treating, in a controlled gaseous atmosphere, silicon wafers or like articles utilized in the production of semiconductor devices. The furnace 7 is illustrated schematically in the attached drawings and the source of heat therein has not been illustrated in view of the standard and well known construction of such a furnace and its operative components.

As noted herein previously, with prior known heat treating procedures utilizing such a diffusion furnace, it has been common to utilize batch procedures in which a plurality of wafers to be treated are placed on a heat resistant carrier, such as a quartz block, and inserted manually into and retained in the furnace for the desired period of time, after which the block with its heated wafers thereon are manually moved from the furnace and placed on a cooling block to reduce the temperature of the wafers. Such manual procedures leave much to be desired in that reproducible and consistent results are not obtainable and such results very depending upon the dexterity and skill of the furnace operator. Such batch procedures also are slow and cumbersome and produce undesirable non-uniform temperature loads on the furnace.

With the present invention, individual articles are transferred through the furnace while supported on a fluid bearing emanating from the track structure 2 and are rapidly quenched following movement through the furnace to insure the reproducibility of results and high speed of operation uncharacteristic of prior known procedures.

In that regard, article receiving means, generally designated 8, are positioned at a first or outfeed station positioned at one end of the apparatus and other article receiving means, generally designated 9, are positioned at a second or infeed station at the opposite end of the apparatus. Such article receiving means 8 and 9 preferably are substantially identical and differ from each other only in the fact that means 8 is conditioned to discharge articles therefrom individually in sequence while means 9 is conditioned to receive articles therein individually in sequence. As noted previously, such articles are fragile thin wafers but may be other articles also. In that regard, reference is hereafter directed to handling silicon wafers but the broader aspects of this invention should be recognized also.

The respective means 8 and 9 each include wafer receiving magazines, designated 11 and 12 respectively, in which a plurality of wafers designated W are positioned or receivable. Provided in conjunction with each of the magazines 11 and 12 is indexing mechanism (not shown) for vertically indexing the respective magazines to bring wafer receiving slots provided therein into alignment with fluid bearing track structure provided in conjunction therewith. Such track structure effects automatic discharge of wafers in sequence from magazine 11 and automatic introduction of the wafers in sequence into magazine 12 without requiring any manual handling of the wafers. In that regard, a section 13 of fluid bearing track structure is provided in conjunction with and extends into magazine 11 and its indexing means and a similar section 14 of fluid bearing track structure is provided in conjunction with and extends into magazine 12 and its indexing mechanism. Track sections 13 and 14 are substantially identical in construction.

In that connection, details of construction and mode of operation of the respective magazines 11 and 12, the means for indexing the same, and the track sections 13 and 14 utilized in conjunction therewith, are illustrated in full detail in the aforementioned Lasch et al. application Ser. No. 779,033 and reference is directed thereto for a full understanding thereof.

For purposes of this disclosure, it is deemed sufficient to relate that outfeed magazine 11 is indexed sequentially vertically downwardly to bring the lowermost wafer of the supply in the magazine generally into alignment with the upper surface of track structure 13 so that such lowermost wafer may be automatically withdrawn from the magazine when fluid is temporarily introduced into the track structure. Upon the lowermost wafer being withdrawn from magazine 11, the magazine is automatically indexed downwardly to bring the next wafer into alignment with the upper surface of the track structure so that it is ready to be discharged onto the track structure when fluid is subsequently introduced through the track structure into engagement with such wafer.

The infeed magazine 12 is sequentially indexed vertically upwardly to bring successive empty article receiving slots thereof into general alignment with the upper surface of track structure 14 so that wafers, following treatment and transfer thereof to the discharge station, may be introduced automatically into successive empty slots of the magazine 12 until the same is filled. Such introduction is effected by periodically introducing fluid into track structure 14 to effect movement of wafers in sequence into magazine 12.

Preferably, the capacity of each of the magazines 11 and 12 is uniform so that when magazine 11 has been emptied, magazine 12 has been filled. Thereafter, each of such magazines may be replaced with other magazines and the sequence repeated. Thus, with the present procedure, no manual handling of any of the wafers being transferred and treated is necessary and the only manual operation is the periodic replacement of a full outfeed magazine 11 and an empty infeed magazine 12 into the apparatus at appropriate intervals.

The track structure sections 13 and 14, with respect to their fluid bearing aspects, may take the construction and configuration illustrated in Lasch et al. application Ser. No. 779,033. However, a somewhat simplified and more preferable track construction is the type shown in Lasch application Ser. No. 174,808 and such construction is perhaps better suited for track sections 13 and 14. Reference is directed to that latter mentioned Lasch application for details of construction of such an improved track structure.

For purposes of this invention, and referring to FIG. 1, it should be understood that each of the track structure sections 13 and 14 is provided with one or more longitudinal series of fluid passages, designated 16 and 17 respectively, which extend upwardly therethrough and open onto the upper surface thereof. Such fluid passages are oriented in conjunction with bearing fluid plenum chambers positioned beneath the track structures which are designated 18 and 19 in the schematic showing of FIG. 4. Such plenums are in operative communication with a supply of bearing fluid as will be described.

Provided adjacent the outfeed magazine 11 in track structure 13 is a photoelectric wafer sensor 21. A similar wafer sensor 22 is provided adjacent the discharge end of the apparatus in conjunction with the wafer quenching means to be described.

Interposed between the track structure 14 at the discharge end of the apparatus and the heat resistant track structure 2 extending through furnace 7 are means, generally designated 23, for rapidly reducing the temperature of wafers discharged in sequence from the furnace 7. Such quenching means comprises a chill plate structure having a series of bearing fluid passages 24 extending therethrough which are in communication with a plenum 26 as seen in FIG. 4. Such fluid passages are provided to effect movement of wafers onto and off the chill plate structure as desired.

Such chill plate structure further includes means for rapidly stopping a wafer passing thereover and holding the wafer thereon for a predetermined time. Such means in the embodiment illustrated comprises a series of vacuum openings, generally designated 27, which are selectively connected with a vacuum source as will be described so that a wafer passing over the plate structure may be held until the same is cooled.

Preferably provided in conjunction with the vacuum structure is additional means for holding the wafer on the chill plate structure. Such means takes the form of a fluid jet nozzle 28 which is positioned and supported generally above the vacuum section of the chill plate. Such nozzle is designed to direct a stream of air or gas downwardly onto a wafer positioned on the plate structure to assist in holding the same flat on the chill plate during the rapid quench operation.

Separate fluid supply means are provided in conjunction with the operative sections 3 and 4 of the heat resistant track structure 2. In the embodiment illustrated in FIGS. 2 and 3, such fluid supply means comprise a pair of separate conduits 31 and 32 which are designed to introduce bearing fluid selective into the track structure 2 for passage therethrough upwardly into contact with wafers to be transported thereover. Such fluid supply means is regulated by control means to be described so that movement of wafers over track structure 2 may be effected at varied rates, including a full stop if desired, as may be necessary for effective treatment of the wafers to produce a particular type of semiconductor device.

Referring now to FIGS. 2 and 3, details of the improved fluid bearing track structure of this invention will be described. As seen in FIG. 3, such track structure 2 comprises a hollow, generally flat one piece tube having opposed sidewalls 36 and 37 and opposed top and base walls 38 and 39 respectively. Such track structure tube is formed from a suitable refractory heat resistant material, such as quartz or silicon carbide, which is unobstructive to heat energy directed thereagainst from the heating elements of furnace 7. Similarly, the cylindrical enclosure 6 surrounding the tube track structure 2 is formed from a suitable heat transparent refractory material, such as quartz or silicon carbide, which is also unobstructive to heat energy.

As noted from FIG. 2, track structure 2 is bonded in the opposite end walls 41 and 42 of the enclosure 6 so that a gas tight relationship is formed therebetween. In that same regard, the fluid supply conduits 31 and 32 extend through the end wall 41 and are sealed therein by use of any suitable heat resistant sealant in gas tight fashion relative thereto.

It will be noted that conduit 32 extends to a location substantially midway of the tube of the enclosure 6 where it passes through a quartz or like divider baffle plate 43 positioned to extend transversely of the enclosure 6 and surrounding track structure tube 2 as seen in FIG. 2. The track structure tube 2 extends through the baffle plate in gas tight relationship therewith and the baffle plate divides the track into the aforementioned sections 2 and 3. Thus, conduit 32 opens into a plenum portion 44 of the enclosure 6 which lies to the right of the baffle plate when viewed in FIG. 2. As a result, bearing fluid may be introduced into portion 44 of the enclosure independently of plenum portion 46 of the enclosure which lies to the left of FIG. 2. The other conduit 31 opens into plenum portion 46 of the enclosure and introduces bearing fluid into such portion independently of portion 44 serviced by conduit 32.

As also noted from FIG. 2, the base wall 39 of the tube structure 2 is provided in each of its sections 3 and 4 with a series of fluid passages extending therethrough. The passages in section 3 are designated 47 and those in section 4 are designated 48. The configuration of such fluid passages is selected in accordance with the speed and manner of movement desired for the wafers and it will be noted that such passages are formed generally with the configuration of a tapered jet nozzle which opens onto the upper surface of the base 39 of the track structure to effect directional movement of the fluid therethrough for effecting longitudinal movement of wafers thereover from the right to left in FIG. 2 as noted by the arrows therein.

In that connection, the considerations involved in designing the fluid passage nozzles are described in detail in the aforementioned Lasch et al and Lasch applications and reference is directed thereto for an understanding of such considerations. However, because of the heat resistant material from which the track structure 2 is formed is very difficult to produce in the configuration desired, the fluid passages 47 and 48 formed therein may not include the complex curved configurations of the jet nozzles illustrated in the aforementioned applications. That is, manufacturing considerations normally dictate that essentially straight tapered jet passages, formed to extend at a predetermined angle relative to the upper surface of the base wall 39, be utilized.

Normally, a single row of longitudinally extending fluid passages are adequate to effect the wafer movement desired. However, two or more parallel rows of such passages may be provided in base wall 39 if required to handle large wafers.

It will be noted from FIG. 2 that the fluid passages 47 in section 3 of track structure 2 are generally equally spaced longitudinally therealong while the passages 48 in section 4 of the track structure are unequally spaced therealong. The spacing of passages 48 is substantially closer together adjacent the baffle plate 43 so that initial movement and rapid acceleration of a wafer through the track section 4 may be effected upon introduction of bearing fluid into plenum portion 46 of enclosure 6. Such rapid acceleration is effected to produce rapid quenching of wafers in sequence to effect the speed of operation and uniformity of results produced with the subject invention.

In that regard, it should be understood that in certain steps in the fabrication of semiconductor devices it is necessary to heat and hold the devices at a substantially high temperature, such as 1100° C. or 1150° C., and to thereafter rapidly quench the same to below 600° C., preferably to 100° C. or below. Such heating and rapid quenching is necessary to control the lifetime of minority carriers after commonly known operations, such as gold diffusion and spike alloying, have been effected on the wafers. It is important that such quenching should be as rapid and reproducible as possible and the present invention has been designed to produce such reproducibility and rapidity. As noted previously, such features are not obtainable with current practices utilizing batch heat treating processes. The present invention effects wafer cooling from temperatures as high as 1150° C. to approximately room temperature safely and rapidly so that minority carrier lifetime control, after gold diffusion, spike alloying, and like known operations, is insured.

The subject apparatus is designed to withdraw wafers in sequence from the outfeed magazine 11 and to move the same individually and at a predetermined rate and in a straight line path through section 3 of the track structure 2 past the baffle plate 43. During such movement (in continuous fashion in the apparatus illustrated herein but in discontinuous or non-straight fashion in modifications of this invention not shown herein which are to be described by separate applications), the temperature of the wafer is elevated to that of the furnace environment through which it is passing.

In that regard, movement of the wafer over track section 3 is continuously effected because bearing fluid is continuously introduced through conduit 32 into plenum portion 44 of enclosure 6. Thus, a wafer transferred onto track section 3 by the track structure 13 provided in conjunction with the outfeed magazine 11 is carried past baffle plate onto section 4 of the track structure at a predetermined continuous rate. Such rate is selected in accordance with the particular treatment desired for the wafer and is produced by controlling the in-flow velocity and quantity of bearing fluid introduced through conduit 32 into plenum portion 44 of/- the enclosure 6.

While bearing fluid is continuously introduced through the fluid passages 47 of track section 3, bearing fluid is intermittently introduced or pulsed into plenum portion 46 of enclosure 6 for pulsating movement through the fluid passages 48 provided in the track section 4. When a wafer is first transferred onto track section 4, no bearing fluid is emanating from conduit 31 into plenum portion 46. As a result, the wafer comes to a stop at the dwell position shown for wafer W in FIGS. 1 and 2. The wafer is allowed to soak at the elevated temperature noted within the furnace for a predetermined time determined by the treatment the wafer is undergoing. In that connection, the wafer is held in the stop position for a sufficient period of time to reach temperature equilibrium and twenty seconds is an exemplary soaking period.

After such soaking has been completed, a large pulse or blast of bearing fluid is introduced through conduit 31 into plenum portion 46 which emanates through the fluid passages 48 against the undersurface of the wafer. Such pulse of bearing fluid rapidly accelerates the wafer over track section 4 and out of the furnace onto quench plate structure 23. Because the spacing of the fluid passages 48 adjacent baffle plate 43 is quite close, initial movement and rapid acceleration thereof is insured. The spacing of the fluid passages adjacent the discharge end of the track section 4 is greater in that the wafer is moving at the time it passes thereover and less support is required therefor at that location.

It should be understood that, except for the time when the wafer is in the dwell position shown in FIG. 2 and is resting on the base wall 39, it is supported on a fluid bearing emanating from fluid passages and moving above the surface of base wall 39 of the track structure.

In that regard, the fluid bearing utilized may be air, nitrogen, oxygen, a mixture of nitrogen and oxygen; if preferred, chemical dopants commonly utilized in conjunction with heat treatment of silicon and like wafers in known fashion may also be included in the bearing fluid utilized to move the wafers in sequence through track section 3.

Similar bearing fluids may be utilized for moving the wafer across the acceleration section 4 of the track structure. Wafer acceleration at the rate desired normally is effected by introducing bearing fluid into the accelerator track section 4 at pressures of 40 psi minimum and 80 psi maximum and such pressure have been found suitable for handling wafers of the sizes most commonly encountered. Such pressures, of course, may be varied to handle articles of other sizes and weights.

As each wafer is discharged in sequence under rapid acceleration from the track structure 2, the same is carried over sensor 22, the purpose of which will be described subsequently, onto the chill plate structure 23 mentioned previously. When a wafer reaches the chill plate, vacuum is applied thereto from below and a gas jet 28 is simultaneously applied thereto from above to abruptly halt movement of the wafer and to hold the same flat on the chill plate so that rapid cooling thereof is effected.

In that regard, such cooling is accomplished because of the rapid movement of the wafer from the track structure onto the chill plate. Such cooling normally may be completed in about one second from 1150° C. to below 600° C. which is the critical lower limit desired. Cooling to room temperature normally is accomplished in about another one second. Movement of the wafer from the stop position shown in FIGS. 1 and 2 to the chill plate position is accomplished in approximately 200 milliseconds under most operation conditions. Preferably the chill plate is liquid cooled by water or the like passing through conduit structure schematically shown and designated 51 and 52 in FIG. 4. Such cooling liquid passes through the chill plate in the desired path as schematically shown at 53 in FIG. 4. Thus, the temperature of the chill plate may be maintained at a level sufficiently low to effect rapid cooling of all wafers fed thereto in sequence.

Because wafers are fed into the furnace sequentially and individually, no substantial thermal load is placed on the furnace and the heat-up time for the wafers is very rapid. Thus, the temperature of the furnace does not vary noticeably as individual wafers are introduced thereinto. The absence of thermal load on the furnace, plus the rapid quench and precise soak times available with the subject procedure, makes the same highly effective for wafer treatment of the type noted.

While the embodiment thus far described emphasizes the controlled acceleration and rapid cooling rate of wafers, it should be understood that features hereof make the same utilizable in conjunction with analogous but specifically different procedures, such as alternative procedures in which slower cooling is desired but with which reproducible results are essential. Thus, the present invention is utilizable in conjunction with treatment of articles, of which silicon wafers are exemplary, to heat the same to some predetermined level, followed by cooling at a slower but nonetheless predetermined rate. Alternatively, the concepts hereof may be utilized in conjunction with a procedure involving rapid cooling followed by gradual or rapid reheating. This invention lends itself to transfer of articles at selectively varied rates while various thermal operations are performed thereon.

One sequence of operation of the apparatus in the illustrative rapid quench procedure described will now be set out. Magazine 11 is indexed downwardly one position to bring a wafer into alignment with track structure 13 and bearing fluid is introduced into track structure 13 to withdraw the wafer from the magazine and to carry the same over sensor 21. Such passage over the sensor activates a photoelectric responsive preset timing device (not shown) of conventional construction which is correlated to the time of movement of the wafer through track structure 2 over track section 3 thereof to the stop position shown in FIG. 1. Movement over track section 3 is effected because bearing fluid is always passing through conduit 32 into plenum portion 44.

When a predetermined time, determined by the setting of the sensor controlled time, has elapsed, which includes the time for the wafer to pass over track section 3 and to soak at the dwell position shown in FIG. 1, a valve designated 56 in FIG. 1 is automatically opened to introduce a large pulse of bearing fluid through conduit 31 into contact with the track section 4 to rapidly move the wafer from the dwell position onto the chill plate 23.

During such movement, the wafer crosses the second sensor 22 which activates the vacuum of the chill plate and introduces a pulse of air through the jet nozzle 28 to rapidly stop the wafer on the chill plate. Such sensor also initiates a second photoelectric responsive preset timing device (not shown). When the wafer has been held on the chill plate for the desired amount of time in accordance with the setting of the second preset timer, the vacuum and jet blast are automatically turned off and a quantity of bearing fluid is introduced through fluid passages 24 in the chill plate and fluid passages 17 on track structure 14 to transfer the same into a waiting open slot in magazine 12 positioned at the infeed station. Magazine 12 is then automatically indexed upwardly one position to be in a location ready to receive a subsequent wafer introduced thereto. In conjunction with such upward indexing of magazine 12, magazine 11 is downwardly indexed to feed another wafer into the apparatus to repeat the sequence just described. In that connection, indexing of the respective magazines to discharge a subsequent wafer to the system is effected automatically in conjunction with sensing means (not shown) provided in conjunction with the respective magazines in the manner described in the aforementioned applications.

Referring to FIG. 4, the pneumatic system for the subject apparatus is shown schematically and will now be described.

The aforementioned valve 56 which controls pulsing of bearing fluid into track section 4 preferably is a conventional two-way solenoid valve available on the open market. Such valve is interposed between a fluid pressure regulator 57 which is interposed between the valve and a source of bearing fluid, generally designated 58. Thus, when the first preset timer 21 reaches the end of its setting, valve 56 is actuated and a pulse of air is introduced through valve 56 via a conduit 59 into conduit 31 as described previously.

Similar two-way solenoid valves of conventional construction, designated 61, 62 and 63 respectively, are governed by a second fluid pressure regulator 64 also connected with the source of bearing fluid 58. Such valves 61, 62 and 63 operate in unison to introduce a periodic flow of bearing fluid through conduits 66, 67 and 68 respectively, into the track structures 13 and 14 adjacent the respective magazines 11 and 12, into the first track section 3 within the furnace through the aforementioned conduit 32, and into the chill plate structure 23. Actuation of valves 61, 62 and 63 is effected in response to the second preset timer 22 reaching the end of its setting.

The jet nozzle 28 is actuated simultaneously with the application of vacuum to the chill plate structure 23 and with the pulsing of bearing fluid into track section 4 in the furnace. Such jet is carried through a conduit extension 69 provided in communication with the conduit 59 regulated by the aforementioned valve 56 and regulator 57. The vacuum is applied to chill plate 23 through a conduit 71 regulated by a solenoid valve 72 of conventional construction which is interposed between the chill plate and a source of vacuum, generally designated 73. In that regard, vacuum in the range of fifteen inches of mercury minimum, has been found acceptable to effect rapid halting of the wafer passing over the chill plate. Such vacuum is maintained on the chill plate for the period of time determined by the setting of the second preset timer and is released upon such time period elapsing.

Having thus made a full disclosure of a preferred embodiment of this invention, which is directed to an improved procedure and structure for transferring articles, such as silicon wafers, between two predetermined stations through a high temperature environment, and at varied rates of movement, reference is directed to the appended claims for the scope of protection to be afforded thereto.

I claim:

1. A method of handling articles, such as silicon wafers, to support and transfer the same on a fluid supporting and transporting cushion at varied predetermined rates of movement under positive control conditions between two stations, comprising
   A. supporting an article on a fluid bearing emanating solely through a base surface of a track structure over which said article is to pass,
   B. moving said article along a first predetermined and operatively discrete portion of said track structure by introducing a quantity of article supporting and transporting fluid therethrough and causing said fluid to move in a predetermined direction to support said article solely by said fluid emanating through said base surface and to move the same positively in said direction,
   C. moving said article along a second predetermined and operatively discrete portion of said track structure by introducing a quantity of article supporting and transporting fluid therethrough and causing said fluid to move in a predetermined direction to support said article solely by said fluid emanating through base surface and to move the same positively in said direction,
   D. altering the rate at which said article moves on said second portion of said track structure in said direction by altering the flow of supporting and transporting fluid emanating through said base surface of such track structure portion, and thereafter
   E. continuing movement of said article along said second portion of said track structure in said direction for a predetermined period of time by introducing additional bearing fluid thereagainst through said base surface of said second portion of said track structure.

2. The method of claim 1 which includes
   E. halting movement of said article at a predetermined location on said track structure by discontinuing the supply of bearing fluid to said second portion of said track structure so that said article is halted thereon for a predetermined time, and thereafter
   F. pulsing additional bearing fluid through said base surface of said second portion of said track structure so that said article is rapidly accelerated from said location.

3. A method of heat treating articles, such as silicon wafers, comprising
   A. transferring an article from a supply thereof on a fluid bearing emanating from a track structure in a furnace,
   B. moving said article in predetermined fashion through a portion of said furnace,
   C. altering the manner in which said article moves on said track structure within said furnace,
   D. maintaining said article within said furnace on said track structure for a predetermined period of time, and thereafter.
   E. moving said article from said furnace on said fluid bearing track structure.

4. The method of claim 3 in which said article movement through said furnace is altered by altering the flow of bearing fluid through said track structure.

5. The method of claim 3 which includes
   F. discontinuing the supply of bearing fluid to a section of said track structure within said furnace so that said article is halted therein for a predetermined time, and thereafter G. pulsing bearing fluid through said track structure section so that said article is rapidly accelerated from said furnace for cooling.

6. The method of claim 5 which further includes

H. halting said article on a chill plate structure after the same leaves said furnace by applying a vacuum to said plate structure as said article passes thereover, and I. passing cooling fluid through said chill plate to reduce the temperature of said article supported thereon.

7. The method of claim 3 in which articles are heat treated in said furnace in sequence as they are transferred from said article supply in sequence and without requiring manual handling.

8. Fluid bearing apparatus for supporting and transferring articles, such as silicon wafers, between predetermined first and second stations and at varied predetermined rates of movement under controlled conditions on a fluid supporting and transporting cushion, comprising A. fluid bearing track structure extending between said stations comprising
 1. first and second operatively discrete fluid bearing track sections positioned as linear continuations of each other,
 2. said track sections each having directional fluid passages extending only through a base surface hereof,
 3. said fluid passages extending in a predetermined direction so that bearing fluid emanating therefrom positively supports and simultaneously urges an article positioned thereover in said direction without additional assistance, B. separate and operatively discrete bearing fluid supply means in conjunction with said respective track sections in communication with the directional fluid passages provided in the base surface of each section, and C. control means for selectively regulating the flow of fluid through said separate supply means selectively into said directional fluid passages of each of said track sections so that the flow of bearing fluid emanating from the fluid passages in said respective track sections may be varied selectively to selectively and positively move, stop or accelerate articles passing over said track sections in sequence and under positive control conditions.

9. The apparatus of claim 8 which further includes

D. article receiving means positioned adjacent each end of said track structure at said stations,
 1. each said article receiving means including a supply magazine capable of receiving a quantity of said articles therein,
 2. said magazine at said first station initially containing a supply of said articles to be transferred in sequence to said second station,
 3. said magazine at said second station being positioned to receive said articles in sequence as the same are transferred thereto across said track structure, and E. means for indexing said magazines to position articles in sequence to be withdrawn from said first magazine for movement along said track structure and to receive articles therein in sequence from said track structure.

10. The apparatus of claim 8 which further includes

D. a furnace for heating said articles as the same are transferred along said track structure,
 1. those portions of said first and second track sections which are positioned within said furnace being formed from a heat resistant refractory material.

11. The apparatus of claim 10 in which said track structure comprises a heat resistant tube extending through said furnace with said fluid passages extending through the base wall of said tube.

12. The apparatus of claim 8 which further includes

D. vacuum plate structure interposed between said second track section and said second station over which said articles pass,
 1. said plate structure having vacuum passages extending therethrough, E. means for selectively applying a vacuum to said plate structure through said vacuum passages, and F. control means for selectively applying said vacuum to said plate structure when an article is passing thereover to halt movement of said article and hold the same on said plate structure.

13. The apparatus of claim 12 which further includes

G. fluid jet means in conjunction with said vacuum plate structure for directing a stream of fluid against each article passing over said plate structure to assist in holding each such article on said plate structure when movement thereof is to be halted.

14. The apparatus of claim 2 in which said vacuum plate structure further includes
 2. bearing fluid passages extending therethrough, and
 G. control means for selectively regulating the flow of bearing fluid through said fluid passages to move articles in sequence from said plate structure toward said second station.

15. The apparatus of claim 10 which further includes

E. a vacuum plate structure interposed between said second track section and said second station over which said articles pass, F. means for selectively applying a vacuum to said plate structure through vacuum passages provided therein, G. control means for selectively applying said vacuum to said plate structure when an article is passing thereover to halt movement of said article, H. fluid jet means in conjunction with said vacuum plate structure for directing a jet of fluid against each article passing over said plate structure to assist in holding each such article on said plate structure when movement thereof is to be halted, and I. cooling means in said plate structure for rapidly lowering the temperature of each article exiting from said furnace and halted on said plate structure by said vacuum and jet applied thereto.

16. The apparatus of claim 11 which further includes

F. heat transparent enclosure means surrounding said track structure tube and defining a bearing fluid plenum therebeneath, said enclosure means including
 1. a divider plate interposed between opposite ends of said plenum and defining the line of demarcation between said first and second track sections,
 2. said fluid supply means being in individual communication with the respective portions of said plenum so that bearing fluid may be introduced selectively through the fluid passages of said respective track sections.

17. Fluid bearing apparatus for transferring and heat treating articles, such as silicon wafers, between predetermined first and second stations and at varied rates of movement comprising
A. a furnace,
B. fluid bearing track structure extending through said furnace between said stations comprising
1. first and second track sections positioned as linear continuations of each other,
2. said track stations each having fluid passages extending through a base surface thereof,
3. said track structure being formed of heat resistant material, such as quartz,
C. separate bearing fluid supply means in conjunction with said respective track sections, and
D. control means for selectively regulating the flow of fluid through said separate supply means so that the flow rate and velocity of fluid emanating from the fluid passages in said respective track sections may be varied selectively to move, stop or accelerate articles passing over said track sections in sequence.

18. The apparatus of claim 17 which further includes
E. article receiving means positioned adjacent each end of said track structure at said stations,
1. each said article receiving means including a supply magazine capable of receiving a quantity of said articles therein,
2. said magazine at said first station initially containing a supply of said articles to be transferred in sequence to said second station,
3. said magazine at said second station being positioned to receive said articles in sequence as the same are transferred thereto across said track structure, and
F. means for indexing said magazines to position articles in sequence to be withdrawn from said first magazine for movement along said track structure and to receive articles therein in sequence from said track structure.

19. The apparatus of claim 17 in which said track structure comprises a heat resistant tube extending through said furnace with said fluid passages extending through the base wall thereof.

20. The apparatus of claim 17 which further includes
E. chill plate structure over which said articles pass in sequence interposed between said second track section and said second station,
1. said plate structure having vacuum passages extending therethrough,
F. means for selectively applying a vacuum to said plate structure through said vacuum passages, and
G. control means for selectively applying said vacuum to said plate structure when an article is passing thereover to halt movement of said article.

21. The apparatus of claim 20 which further includes
H. fluid jet means in conjunction with said chill plate structure for directing a stream of fluid against articles passing over said plate structure in sequence to assist in holding each such article on said plate structure when movement thereof is halted by said vacuum.

22. The apparatus of claim 20 in which said vacuum plate structure further includes
2. bearing fluid passages extending therethrough, and
H. control means for selectively regulating the flow of bearing fluid through said fluid passages to move articles in sequence from said plate structure toward said second station when said vacuum is removed therefrom.

23. The apparatus of claim 19 which further includes
G. heat transparent enclosure means surrounding said track structure tube and defining a bearing fluid plenum therebeneath, said enclosure means including
1. a divider plate interposed between opposite ends of said plenum and defining the line of demarcation between said first and second track sections,
2. said fluid supply means being in individual communication with the respective portions of said plenum so that bearing fluid may be introduced selectively through the fluid passages of said track sections.

24. Apparatus for transferring articles, such as silicon wafers, between predetermined first and second stations and at varied rates of movement, comprising
A. fluid bearing track structure extending between said stations comprising
1. first and second track sections positioned as linear continuations of each other,
2. said track sections each having fluid passages extending through a base surface thereof,
B. separate bearing fluid supply means in conjunction with said respective track sections,
C. control means for selectively regulating the flow of fluid through said separate supply means so that the flow of bearing fluid emanating from the fluid passages in said respective track sections may be varied selectively to move, stop or accelerate articles passing over said track sections in sequence,
D. article receiving means positioned adjacent each end of said track structure at said stations,
1. each said article receiving means including a supply magazine capable of receiving a quantity of said articles therein,
2. said magazine at said first station initially containing a supply of said articles to be transferred in sequence to said second station,
3. said magazine at said second station being positioned to receive said articles in sequence as the same are transferred thereto across said track structure, and
E. means for indexing said magazines to position articles in sequence to be withdrawn from said first magazine for movement along said track structure and to receive articles therein in sequence from said track structure.

25. The apparatus of claim 24 which further includes
F. vacuum plate structure interposed between said second track section and said second station over which said articles pass,
1. said plate structure having vacuum passages extending therethrough,
G. means for selectively applying a vacuum to said plate structure through said vacuum passages, and
H. control means for selectively applying said vacuum to said plate structure when an article is passing thereover to halt movement of said article and hold the same on said plate structure.

26. The apparatus of claim 25 which further includes
I. fluid jet means in conjunction with said vacuum plate structure for directing a stream of fluid against each article passing over said plate structure to assist in holding each such article on said plate structure when movement thereof is to be halted.

27. The apparatus of claim 25 in which said vacuum plate structure further includes 2. bearing fluid passages extending therethrough, and I. control means for selectively regulating the flow of bearing fluid through said fluid passages to move articles in sequence from said plate structure toward said second station.

* * * * *